United States Patent
Ellis, Jr. et al.

(10) Patent No.: US 11,686,754 B2
(45) Date of Patent: Jun. 27, 2023

(54) COMBINATION MAGNETIC AND CAPACITIVE SENSOR

(71) Applicant: Lexmark International, Inc., Lexington, KY (US)

(72) Inventors: James Howard Ellis, Jr., Lexington, KY (US); Keith Bryan Hardin, Lexington, KY (US)

(73) Assignee: Lexmark International, Inc., Lexington, KY (US)

( * ) Notice: Subject to any disclaimer, the term of this patent is extended or adjusted under 35 U.S.C. 154(b) by 0 days.

(21) Appl. No.: 17/465,593

(22) Filed: Sep. 2, 2021

(65) Prior Publication Data

US 2022/0065910 A1    Mar. 3, 2022

Related U.S. Application Data

(60) Provisional application No. 63/073,581, filed on Sep. 2, 2020.

(51) Int. Cl.
*G01R 27/26*  (2006.01)
*G01R 33/07*  (2006.01)

(52) U.S. Cl.
CPC ......... *G01R 27/2605* (2013.01); *G01R 33/07* (2013.01)

(58) Field of Classification Search
CPC combination set(s) only.
See application file for complete search history.

(56) References Cited

U.S. PATENT DOCUMENTS

| | | | | |
|---|---|---|---|---|
| 2006/0244512 A1* | 11/2006 | Fung | ........... | G11C 5/147 327/530 |
| 2006/0244620 A1* | 11/2006 | Sotiriou | ........... | G08B 21/182 340/815.4 |
| 2013/0249616 A1* | 9/2013 | Priel | ........... | G11C 5/147 327/319 |
| 2015/0015249 A1* | 1/2015 | Ausserlechner | ........... | H01L 24/48 324/252 |
| 2017/0117756 A1* | 4/2017 | Muratov | ........... | H02J 50/60 |
| 2018/0372809 A1* | 12/2018 | Angelini | ........... | G01R 33/075 |
| 2019/0079143 A1* | 3/2019 | Romero | ........... | H03H 17/025 |
| 2019/0113366 A1* | 4/2019 | Bilbao De Mendizabal | ........... | G01R 33/0011 |

* cited by examiner

*Primary Examiner* — Alvaro E Fortich

(57) ABSTRACT

Described is an invention that adds capacitive sensing ability with a single magnetic field sensor location or distributed within an array of surfaces of the sensor. The capacitive sensing can be achieved by modifying a classic Hall effect sensor or putting separate capacitive sensor plates in close proximity to the hall effect sensor.

10 Claims, 5 Drawing Sheets

COMBINATION MAGNETIC AND CAPACITIVE SENSOR

CROSS REFERENCES TO RELATED APPLICATIONS

This application claims priority and benefit under 35 U.S.C. 119(e) from U.S. provisional application No. 63/073,581 titled "Combination Magnetic and Capacitive Sensor," having a filing date of Sep. 2, 2020.

BACKGROUND

1 Field of the Invention

This invention combines capacitive with magnetic field sensing modes using distinct Hall plates in a single unit that can measure both modes sequentially and simultaneously.

2. Description of the Related Art

A study of the literature discloses that if a magnetic field is known outside of a region then interior geometry and sources may not have a unique solution. This is the inverse problem where magnetic sources may have more than one geometry that gives the same solution. A technique is needed that can distinguish between two different magnetic geometries that have the same magnetic field solution over a surface. Magnetic sensors using Hall effect and capacitive sensors using conductive electrodes for area measurements are widely used as single mode sensors.

SUMMARY OF THE INVENTION

Disclosed is an invention that adds capacitive sensing ability with a single magnetic field sensor location or distributed within an array of surfaces of the magnetic sensors. The capacitive sensing can be achieved by modifying a classic Hall effect sensor or putting separate capacitive sensor plates in close proximity to the hall effect sensor. The modifications use the Hall effect plate that can operate in two different modes (magnetic sensing mode and capacitive sensing mode) during different time intervals. This combination can be performed on a semiconductor, rigid PCB, flexible printed circuit, TFT or OFET devices. The Hall effect plates are distinct conductive plates that are electrically isolated from adjacent Hall plates before being connected through switches. Switching elements are used to connect these Hall plates to the desired circuitry for operation.

A magnetic matrix physical unclonable function ("PUF") object is a combination of binder materials and conducting magnetic particles. While the magnetic field of a specific PUF is complex, it may be possible to arrange magnetic materials and magnetization amplitudes with directions that could be interpreted as a copy of the PUF. In contrast to the literature in the art, if the geometry of the conducting magnetic sources and interacting materials are constrained to a predetermined geometry then a unique solution can be determined that is less likely to be copied. In this application, if a magnetic PUF has a known geometry and conducting magnetic source locations then it cannot be cloned unless the construction is an identical geometry. A magnetic source can be a magnetic material that has been magnetized with residual magnetization. The magnetic PUF has been proven to be very difficult to reproduce in its exact form. The addition of capacitive sensing will guarantee that the physical geometry of the conducting magnetic flakes sizes and locations are very similar to the enrolled device. The combination of the magnetic signature and the capacitive signature would be unique and not a substitute for different shapes and materials.

BRIEF DESCRIPTION OF THE DRAWINGS

Figure 1:
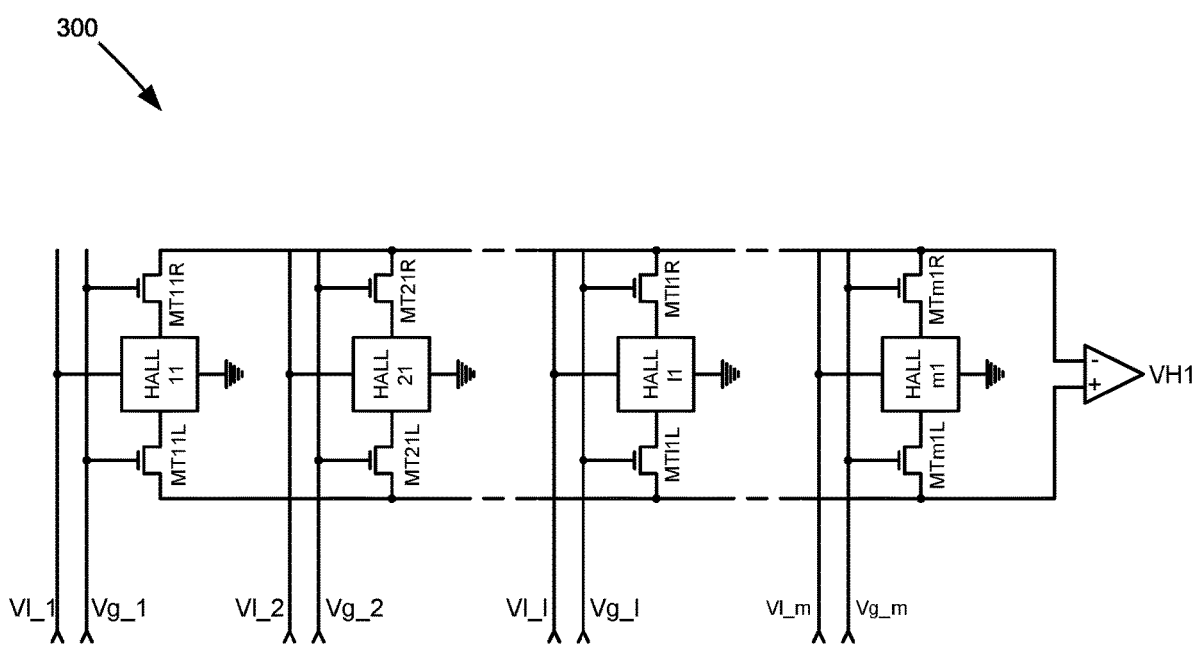

Having thus described the invention in general terms, reference will now be made to the accompanying drawings, which are not necessarily drawn to scale, and wherein:

FIG. 1 shows an excerpt from U.S. Pat. No. 7,902,280, FIG. 2A.

Figure 2:
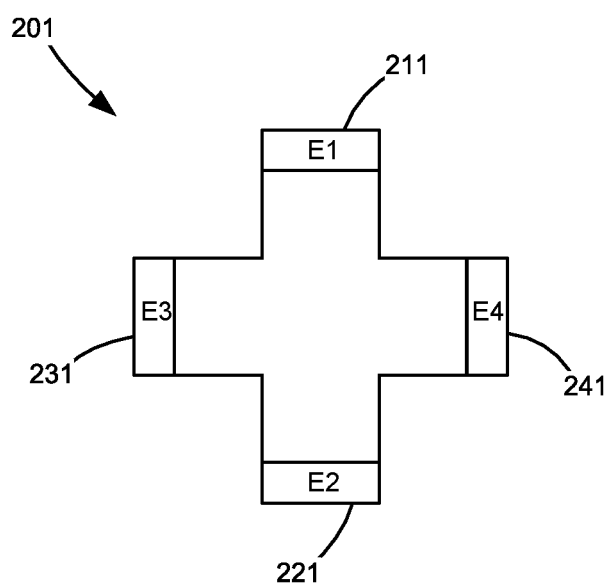

FIG. 2 shows a Hall effect plate.

Figure 3:
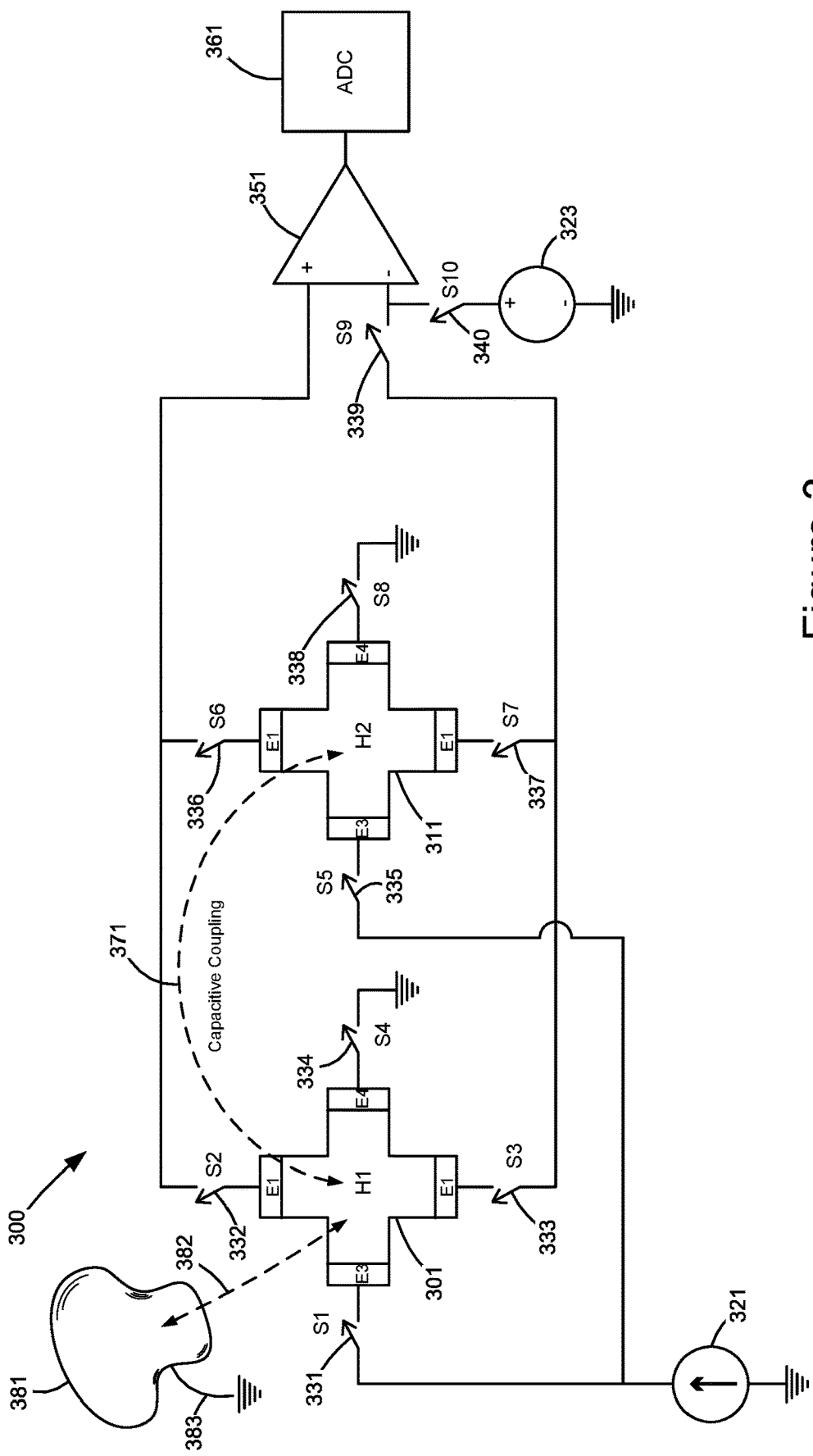

FIG. 3 shows capacitive sensing Hall effect plates.

Figure 4:
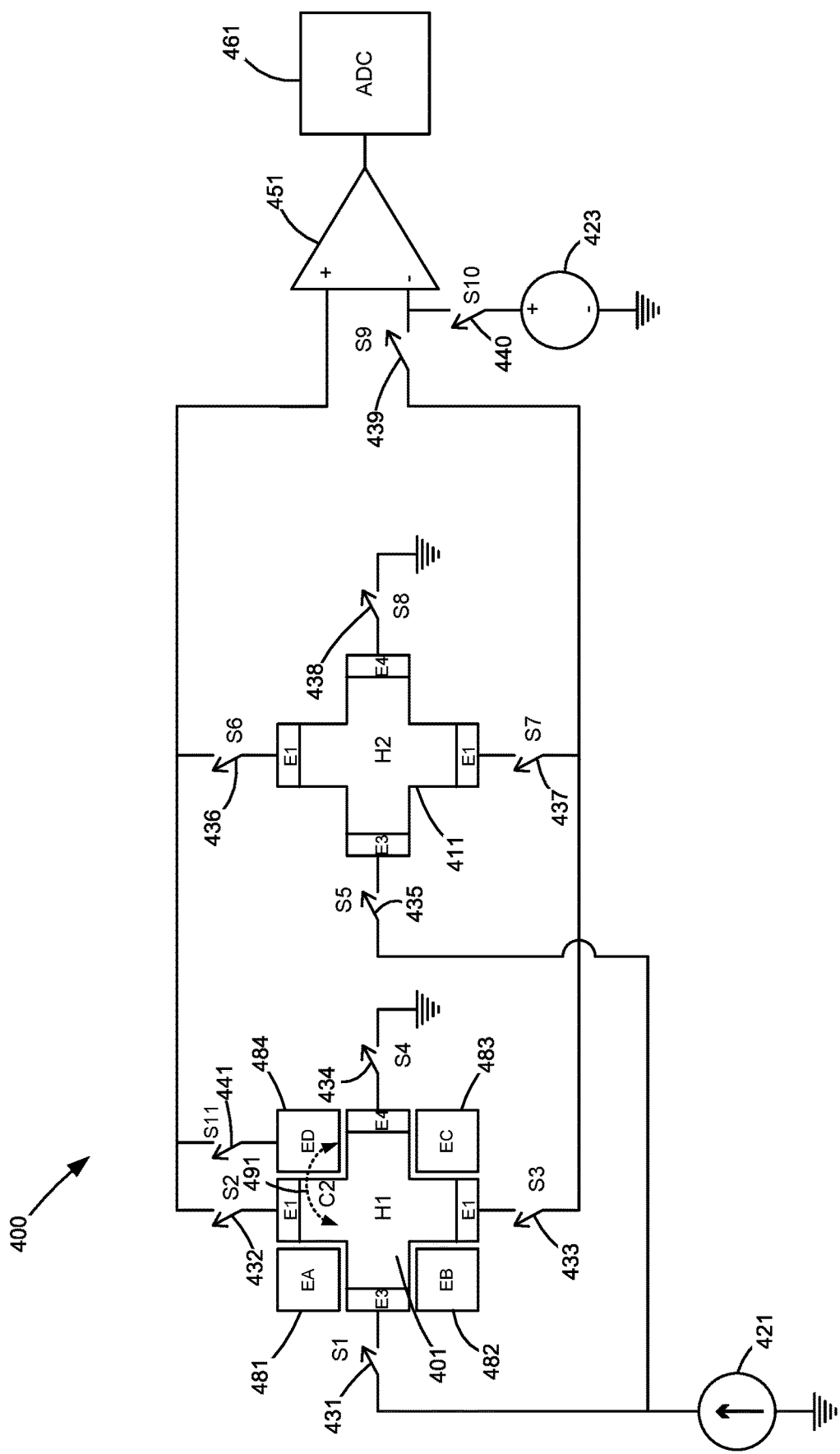

FIG. 4 shows a capacitive sensing Hall effect plate source with adjacent receptors.

Figure 5:
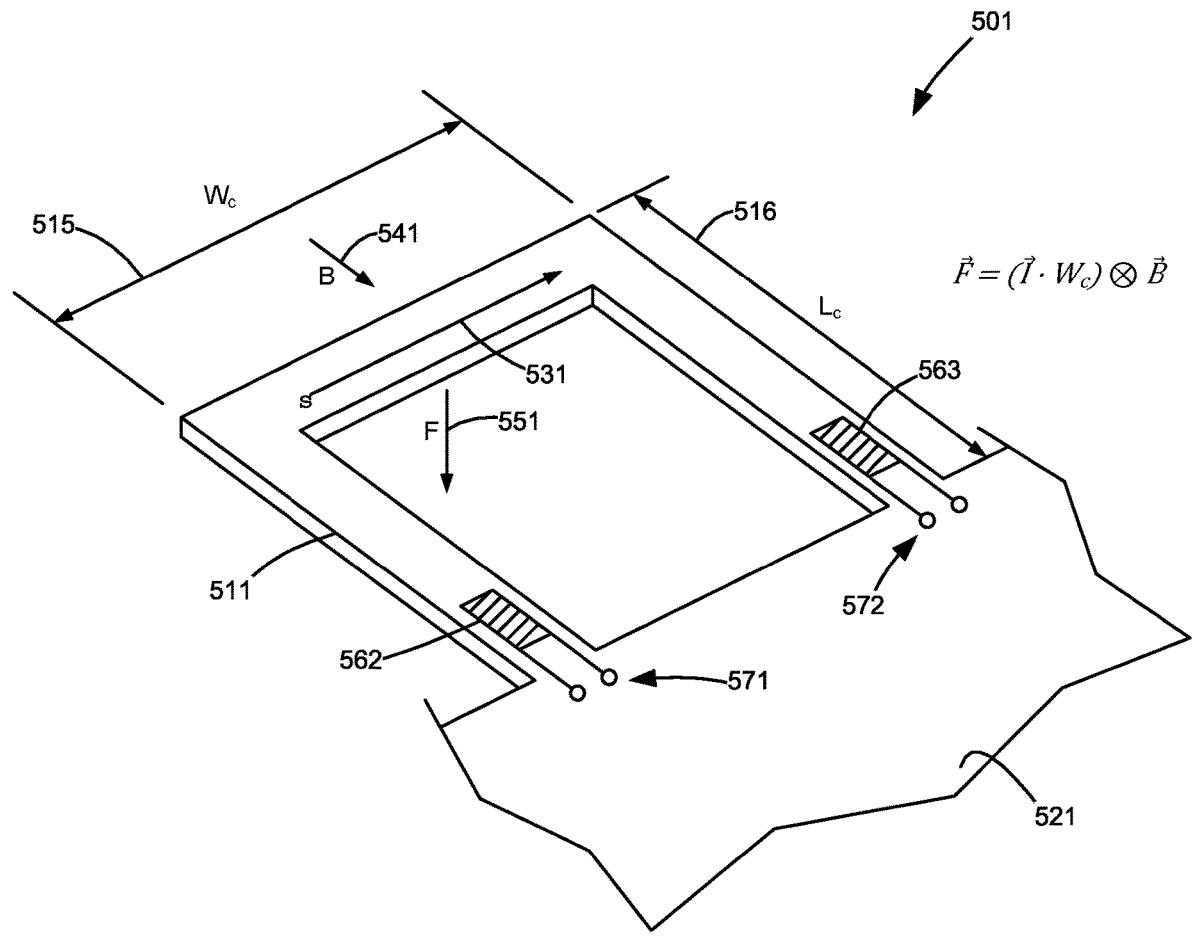

FIG. 5 shows a Micro-Electro Mechanical System (MEMS) beam construction for field sensing.

DETAILED DESCRIPTION

It is to be understood that the present disclosure is not limited in its application to the details of construction and the arrangement of components set forth in the following description or illustrated in the drawings. The present disclosure is capable of other embodiments and of being practiced or of being carried out in various ways. Also, it is to be understood that the phraseology, terminology and dimensions used herein is for the purpose of description and should not be regarded as limiting. As used herein, the terms "having," "containing," "including," "comprising," and the like are open ended terms that indicate the presence of stated elements or features, but do not preclude additional elements or features. The articles "a," "an," and "the" are intended to include the plural as well as the singular, unless the context clearly indicates otherwise. The use of "including," "comprising," or "having" and variations thereof herein is meant to encompass the items listed thereafter and equivalents thereof as well as additional items. Terms such as "about" and the like are used to describe various characteristics of an object, and such terms have their ordinary and customary meaning to persons of ordinary skill in the pertinent art. The dimensions of the magnetic particles, separations between particles and sensor locations are interrelated and can be proportionally scaled with respect to each other to provide different sized solutions.

The present invention is described more fully hereinafter with reference to the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements. Like numerals refer to like elements throughout the views.

This invention combines multiple sensing elements of different types within one sensor that reacts to magnetically charged particles that are electrically conducting. In this disclosure there are several embodiments that can be applied to a semiconductor, TFT, PCB, OFET or flexible circuits. Terms such as Hall plate, electrode, source and receptor may relate to the same physical element within the system depending on the context. A Hall plate is an element typically used to measure a magnetic field. If this Hall plate is driven to create an electric field that it can be consider as a source or electrode. If this same Hall plate is measuring an electric field then it can be consider as a receptor or electrode.

The first embodiment improves on U.S. Pat. No. 7,902,820 by Vervaeke to allow each Hall effect sensor array plate to be an electric field source or receptor within a matrix. The prior art shows an excerpt of the architecture of the two-dimensional Hall sensor array being driven by a voltage source to ground with two sense switches to measure the voltage difference across the Hall effect sensor array plate in FIG. 1 showing the prior art.

A horizontal Hall plate 201 shown in FIG. 2 is a thin conductive material that exhibits a substantial Hall coefficient creating a differential voltage between two electrodes 211 and 221 (E1-E2) when a current is flowing in the transverse direction from 231 to 241 (E3-E4) and can be characterized as a Hall coefficient. This current displacement Hall effect occurs when a magnetic field flows into the page as viewed by an observer. If the Hall plate 201 lies in the X and Y plane (horizontal hall plate), then the magnetic field is in the ±Z direction. If the Hall plate lies along the Z axis (vertical hall plate), then the magnetic field is in the ±X or ±Y direction depending on the rotation around the Z axis. Note that each Hall effect plate 201 has 4 conducting electrodes (E1-E4) and that no other electrodes are connected to a distinct Hall plate. In FIG. 1 from the prior art, the E3 receives the voltage source from VI_x and causes current to flow to the ground pin connected on E4. The differential voltage is measured by connecting the differential amplifier through two FET switches MTxxL and MTxxR that are represented by E2 and E1 respectively. The present invention uses Hall plate 201 for two different modes (magnetic sensing mode and capacitive sensing mode) at different times. During a first-time Hall effect interval, the Hall plate is driven as a standard Hall effect magnetic sensor. During a second-time capacitive interval, the Hall plate is used as a conducting capacitive sense element. During the capacitive interval the Hall plate can be used in different capacitive sense modes (loading mode and shunt mode) as well. A switch control means is used to coordinate the switches between one measurement mode and other. A single Hall plate can be used in a loading or self-capacitance sensing mode. This mode senses a conductive body (381) that is grounded (383) or large enough to behave like a grounded object close to the electrode. The field coupling line (382) shows the coupling path for this mode. Two Hall plates are used for shunt mode capacitive sensing, shown by the capacitive coupling path 371, where the source or receptor elements will detect electric fields or current that is either transmitted along a conducting surface or shunted by the materials that are located in the PUF when it is brought near the sensing elements. If a conductive body (381), grounded or ungrounded, is located near the source and receptor electrodes then its presence will perturb the fields and be detected. The characterization of the PUF is then determined by a first time period that measures the magnetic fields of the PUF magnetic source flakes and then in a second time period that measures the capacitive effects of the conducting materials in the dielectric binder. Since the magnetic source flakes are conductive then there will be a substantial capacitive effect by the same flakes. Additional non-magnetic conducting materials may be loaded in the PUF to only respond to the capacitive sensing.

For the current invention, one or more Hall plates located anywhere in the sensor array can be used a capacitive source while one or more other Hall plates located anywhere else in the sensor array may be used as a capacitive receptor for a shunt mode capacitive sensing device. This is accomplished by adding additional switching transistors in the E4 path 241 and allowing the differential amplifier to be a single ended amplifier with an analog to digital converter (ADC). The configuration also supports a single hall plate to be used as a driving point self-impedance measuring device. A key feature of this invention is that both the magnetic field and capacitive effects can be measured by a single sensor and the results are measurements that are spatially located with respect to each other. It would be very difficult to use two different sensors placed on a PUF and get both the magnetic and capacitive results to be high aligned and spatially located. Another aspect is that rapid measurement of both the magnetic and capacitive patterns means that it would be impossible to substitute different PUF materials to counterfeit the PUF by using two different objects that had a single mode of matching at a time.

It is to be understood that each switch may be a FET, bipolar or any device that can change its state between a high and low impedance under a controlling mechanism. The source may be an AC signal, or the switches may be used to create the AC signal.

FIG. 3 shows two Hall plates 301, 311 to be used as a capacitive sensor 300. When switches S1 (331), S2 (332), S3 (333), S4 (334), and S9 (339) are closed then the circuit acts as a Hall effect device as previously disclosed. When switches S1 (331), S6 (336), and S10 (340) are closed then the circuit acts as a shunt mode capacitive sensor with 301 being the source plate and 311 being the receptor plate. The voltage source 323 connected to S10 (340) provides a reference threshold voltage if needed. Switches S5 (335), S7 (337) and S8 (338) are closed when Hall plate 311 is operated in magnetic field sensing mode but are open when it is being operated as a receptor plate.

The current source 321 may also be a voltage source depending on the resistance of the Hall plates 301, 311. The same Hall plate and circuitry now has a dual function of magnetic and capacitive sensing.

In another embodiment, switches S1 (331), S2 (332) and S10 (340) are closed then the circuit acts as a driving point self-impedance mode capacitive sensor. The remaining switches are open. In this configuration, the sensing is for capacitive coupling is between a Hall plate and an external conductive body that is either grounded or large enough a self-capacitance that is large enough to be detected. Additional capacitive surface area may be needed in some instances that can be achieved by connecting more than one Hall plate in parallel. In FIG. 3 switches S1 (331) and S5 (335) are closed to apply the source 321 to both 301 and 311 Hall plates. Switches S2 (332) and S6 (336) are closed to connect the Hall plates to amplifier (351) with S10 (340) closed to create a two Hall plate driving point impedance test. This technique can be used to make larger Hall plate capacitive source or receptor electrodes for both the self and shunt capacitive sensing modes.

In another embodiment, the system 400 has conducting electrodes 481, 482, 483, 484 (EA-ED) are added adjacent to the Hall plates as shown in FIG. 4. In this geometry the electrodes 481, 482, 483, 484 (EA-ED) may be connected with a conducting wire (not shown) and S11 (441) can be used to couple the receptor signal from the ED electrode 484 to the amplifier 451 then to the ADC 461. The reference source 423 is connected to the amplifier 451 by closing switch S10 (440). This allows each Hall plate region to be used its own sensor area. The C2 designation 491 shows the electric field coupling path for the capacitive sensor. In this configuration S1 (431) is closed to drive the Hall plate 401 using source 421. Switches S2 (432), S4 (434), S3 (433), S9 (439), S5 (435), S6 (436), S7 (437), S8 (439) are left open on Hall plate 411. If EA-ED (481, 482, 483, 484) are connected with a conducting closed loop, then it will represent a shorted turn that will tend to reject AC magnetic fields but will not affect the static magnetic fields if it is applied long enough and the shorted turn has sufficient loss. If this effect is not desired, then the loop may be broken by leaving out one connected between any pair around the loop.

It should be noted that the conducting electrodes of EA-ED (481, 482, 483, 484) may be any number or shape. Similar conducting electrodes to EA-ED (481, 482, 483, 484) may be added to all of other Hall plate like 411 in the array if desired. There may be some cases where the additional conducting electrodes are not desired as well. The preferred system will have a similar total area for the source plate or receptor plate. It should also be noted that the system of source and receptor plates may be used over an area of one sensor or an array of sensors over an area that is representative of large semiconductor integrated circuit which is currently up to an approximately size of 28 mm on a side. However, this technology can be applied to larger scaled technologies like TFET or PCB materials making the scale unrestricted.

In another embodiment, the source and receptor electrode may be operated far apart from each other. This technique would be useful for multi-factor detection where the element within a physical unclonable function (PUF) material is a wire of some length or an information layer.

In such a PUF, flake sizes are preferably less than or equal to 500 µm. The minimum desire is to have at least 2 sensor locations for each flake location. This is the minimum number to meet a positional Nyquist sampling theorem. The median flake size would be closer to 250 µm with a lower range of 50 µm. This would result in a preferred sensor spacing that would be a surface array with adjacent sensors less than 125 µm. For flake sizes near 50 µm, the sensor spacing would be less than 50 µm.

It is also understood that horizontal Hall plates (lies in X and Y plane) and vertical Hall plate (lies along the Z axis) configurations may be added to this invention to create an X, Y and Z directed magnetic field sensor over a planar surface while the capacitive sensor is only a scaler quantity needed across the X and Y plane orientation. However, both the horizontal Hall plates (facing in the Z direction) and the vertical Hall plates (facing in the X or Y directions) can be used as capacitive electrode plates but may not be as effective. This means that one or more horizontal hall plates may operate as electrodes for self-capacitive sensing or as a source or receptor electrode for shunt capacitive sensing, with appropriate switch settings (as previously described). Moreover, it also means that one or more vertical hall plates may operate as electrodes for self-capacitive sensing or as a source or receptor electrode for shunt capacitive sensing, with appropriate switch settings. Furthermore, it also means that any combination of one or more horizontal and one or more vertical hall plates may be used as a source and receptor electrode for shunt capacitive sensing, with appropriate switch settings. Finally, the location of the source or receptor electrodes may be located anywhere in the sensor array.

Referring to FIG. 3, only one source 321 and amplifier 351 with ADC 361 are shown that can be described as a measurement channel. To speed the measurement time for an array of magnetic and capacitive sensors, multiple measurement channels may be employed to make parallel measurements of any combination of magnetic or capacitive configurations simultaneously. With multiple measurement channels, both the magnetic and capacitive mode sensing can be done simultaneously on different electrode locations. The switch control means is used to coordinate the switches to the desired measurement mode (magnetic measurement mode, capacitive measurement mode, mixed magnetic and capacitive measurement mode) for each sensor element in the array. Finally, the switch control enables rapid successive measurements of any combination of magnetic or capacitive sensing configurations.

The invention of adding capacitive sensing may be added to many forms of magnetic field sensing. For example, the "SOC Design Methodologies: IFIP TC10/WG10.5 Eleventh International Conference on Very Large Scale Integration of Systems-on-Chip (VLSI-SOC '01) Dec. 3-5, 2001, Montpellier, France" has a micro-electro mechanical system (MEMS) beam construction show in FIG. 5. This mechanical structure 501 consists of a U-shaped cantilever 511 of width Wc, 515, and length Lc, 516, embedded in an aluminum planar coil 521. The coil is supplied with an electric current I, 531, that can be continuous or alternative. When an external magnetic field B, 541, is present, the cantilever beam is deflected due to the action of the Lorentz force F, 551, applied to its free side. Two polysilicon strain gauges, 562, 563 are located in the mechanical structure 501 close to anchor points 571, 572 in order to detect the deflections.

The strain gauges 562, 563 are used to measure the displacement of the beam resulting in the magnetic field. The Hall plates shown in FIG. 4 may be substituted in the MEMS geometry in FIG. 5. This is just one MEMS technique that can combine magnetic field sensing with capacitive sensing. The U-shaped cantilever is a conducting element that can have switching elements added at the base sections. When the U-shaped cantilever is only connected at one end then the element will act as a capacitive electrode like the Hall plates previously discussed. Addition conduction electrodes may be places in the surrounding areas to the U-shaped cantilever similar to the electrodes added to FIG. 4.

The foregoing description illustrates various aspects and examples of the present disclosure. It is not intended to be exhaustive. Rather, it is chosen to illustrate the principles of the present disclosure and its practical application to enable one of ordinary skill in the art to utilize the present disclosure, including its various modifications that naturally follow. All modifications and variations are contemplated within the scope of the present disclosure as determined by the appended claims. Relatively apparent modifications include combining one or more features of various embodiments with features of other embodiments.

We claim:

1. A capacitive sensor device comprising:
   two Hall sensor plates;
   a differential amplifier used as a single ended amplifier with an analog to digital converter;
   a voltage source providing a reference threshold voltage;
   additional switching transistors that can change a state between a high and low impedance; and
   conducting electrodes adjacent to the Hall plates, wherein if the electrodes are connected with a conducting closed loop, then a resulting shorted turn will tend to reject alternating current magnetic fields but will not affect a static magnetic field if applied long enough and the shorted turn has sufficient loss.

2. The device of claim 1 wherein the switching transistors may be a field effect transistor or other bipolar device.

3. The device of claim 1, wherein a source and a receptor electrode are operated far apart from each other for multi-factor detection where the device is within a physical unclonable function.

4. A magnetic and capacitive sensor device comprising:
- time interval where Hall plate electrodes are connected to make a Hall effect magnetic sensor;
- a time interval where the Hall plate electrodes are connected to make a capacitive sensor; and
- a switch control that enables the change of switched connections.

5. The device of claim 4, where the switch control connects multiple Hall plates together forming a larger conducting area.

6. The device of claim 4, where the switch control connects Hall plates creating a driving point capacitive sensor.

7. The device of claim 4, where the switch control connects multiple Hall plate channels to measure both magnetic and capacitive modes simultaneously.

8. The device of claim 4, where the switch control connects Hall plates sequentially between magnetic and capacitive modes.

9. The device of claim 4, where the switch control connects X-direction or Y-direction facing Hall plate channels to measure both magnetic and capacitive modes.

10. The device of claim 4, where the switch control connects Z-direction facing Hall plate channels to measure both magnetic and capacitive modes.

* * * * *